United States Patent
Huang et al.

(10) Patent No.: US 7,464,346 B2
(45) Date of Patent: Dec. 9, 2008

(54) METHOD FOR DESIGNING PHASE-LOCK LOOP CIRCUITS

(75) Inventors: Mu-Jen Huang, Taipei (TW);
Chien-Hung Chen, Taipei (TW);
Chih-Chiang Chang, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 284 days.

(21) Appl. No.: 11/472,199

(22) Filed: Jun. 20, 2006

(65) Prior Publication Data

US 2008/0007348 A1    Jan. 10, 2008

(51) Int. Cl.
*G06F 17/50*    (2006.01)

(52) U.S. Cl. .............................. 716/1; 716/12

(58) Field of Classification Search ............... 716/1–18; 331/14, 16, 17, 25; 327/157, 170; 455/260
See application file for complete search history.

(56) References Cited

U.S. PATENT DOCUMENTS

| | | | | |
|---|---|---|---|---|
| 4,007,429 A | * | 2/1977 | Cadalora et al. | 331/17 |
| 5,151,665 A | * | 9/1992 | Wentzler | 331/8 |
| 5,272,452 A | * | 12/1993 | Adachi et al. | 331/17 |
| 5,650,754 A | * | 7/1997 | Joshi et al. | 331/36 C |
| 6,704,908 B1 | * | 3/2004 | Horan et al. | 716/1 |
| 7,184,732 B2 | * | 2/2007 | Saito | 455/260 |
| 2002/0041214 A1 | * | 4/2002 | Ichimura | 331/14 |
| 2003/0042953 A1 | * | 3/2003 | Shin | 327/170 |
| 2005/0052250 A1 | * | 3/2005 | Tanzawa | 331/23 |

* cited by examiner

*Primary Examiner*—Sun J Lin
(74) *Attorney, Agent, or Firm*—K & L Gates LLP

(57) ABSTRACT

A method for designing a phase-lock loop (PLL) circuit is disclosed. The method includes the following steps. A first set of intellectual properties, each of which represents a control circuit implemented on a semiconductor substrate, is provided. A second set of intellectual properties, each of which represents a filter implemented on the semiconductor substrate, is provided. Intellectual properties are selected from the first and second sets based on a predetermined specification of the PLL circuit. The selected intellectual properties are integrated as an integrated intellectual property representing the PLL circuit, such that a layout area of the PLL circuit implemented by using the integrated intellectual property is configured based on the predetermined specification.

21 Claims, 5 Drawing Sheets

METHOD FOR DESIGNING PHASE-LOCK LOOP CIRCUITS

BACKGROUND

The present invention relates generally to integrated circuit (IC) designs, and more particularly to a method for designing phase-lock loop (PLL) circuits.

A PLL circuit is one of the most popular feedback systems for providing closed loop frequency control that can be found in many products such as cell phones, televisions, radio, pagers, computers and other telecommunication devices. The PLL circuit operates based on a phase difference between input and output signals of a controlled oscillator. A typical PLL circuit is composed of a phase detector, a charge pump, a voltage controlled oscillator (VCO), and a loop filter. The phase detector is a nonlinear device that outputs a signal representing a phase difference between two oscillating input signals. The charge pump is a device that converts the phase difference into a current. The VCO is also a nonlinear device whose oscillation frequency is controlled by a low voltage input signal. The loop filter is a low-pass filter (LPF) that is necessary in order for the PLL circuit to function properly.

The PLL circuit is not simple in design. An IC manufacturer typically provides its customers with a set of already verified PLL intellectual property (IP). The term IP refers to the data representing a circuit design to be implemented on a semiconductor substrate. Conventionally, the PLL IP is generally designed for satisfying a broad range of applications. While the generally-designed PLL IP may be used to provide a clock source that operates properly for its required task, its circuit performance is less than optimal. Furthermore, such PLL circuit usually occupies an undesirably large layout area.

One solution to the above-mentioned issues is to have the PLL circuit customarily designed in order to improve its area utilization and performance. However, the customized designs are expensive and time-consuming. Furthermore, the equipment used for supporting the customized designs usually requires a lot of maintenance. Since each customized PLL circuit is unique, the PLL IP resulted therefrom cannot be flexibly used in designing other PLL circuits.

Thus, it is desirable to have an improved service model for IC manufacturers that provides the customers with the PLL IP, which can be flexibly used for a broad range of applications, without compromising on their circuit performance and area utilization.

SUMMARY

The present invention discloses a method for designing a phase-lock loop (PLL) circuit. The method includes the following steps. A first set of intellectual properties, each of which represents a control circuit implemented on a semiconductor substrate, is provided. A second set of intellectual properties, each of which represents a filter implemented on the semiconductor substrate, is provided. Intellectual properties are selected from the first and second sets based on a predetermined specification of the PLL circuit. The selected intellectual properties are integrated as an integrated intellectual property representing the PLL circuit, such that a layout area of the PLL circuit implemented by using the integrated intellectual property is configured based on the predetermined specification.

The construction and method of operation of the invention, however, together with additional objects and advantages thereof will be best understood from the following description of specific embodiments when read in connection with the accompanying drawings.

DESCRIPTION

Figure 1A:
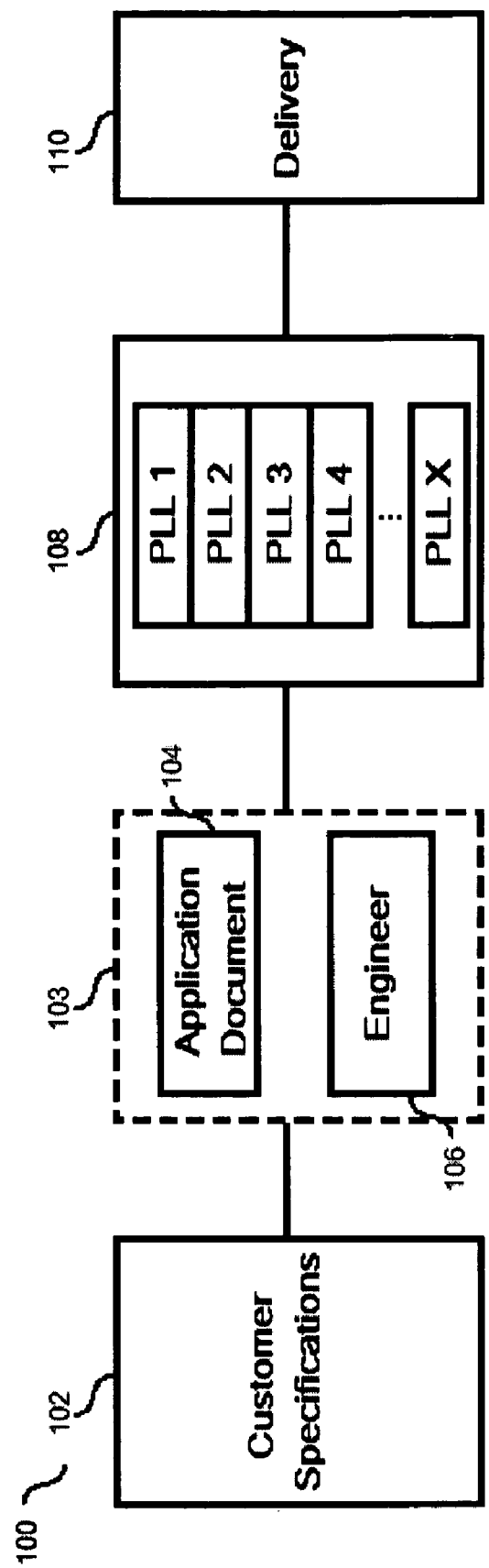
FIG. 1A illustrates a process flow of a conventional service model for providing a PLL IP to a customer of IC manufacturers.

FIG. 1A illustrates a process flow 100 of a conventional service model for providing the PLL IP to a customer of IC manufacturers. To begin the process flow, the customer provides the specifications of a PLL circuit design in a block 102. The specifications generally include information regarding the operation frequency and resolution of the PLL circuit. A block 103, which is optional, includes an application document block 104 and an engineering input block 106. In the application document block 104, the specifications and other related information are complied together. The related information may include suggestions and comments provided by one or more engineers in the engineering input block 106. Based on the output from the block 103, a PLL IP can be chosen from a PLL library in the block 108. The chosen PLL IP is designed for general purposes to cover a broad range of applications. Once the PLL IP is chosen, it can be delivered to the customer in a block 110.

One drawback of using the generally-designed PLL IP is that it may occupy an undesirably large layout area. Moreover, performance of the PLL circuit manufactured by using the PLL IP is less than optimal.

Figure 1B:
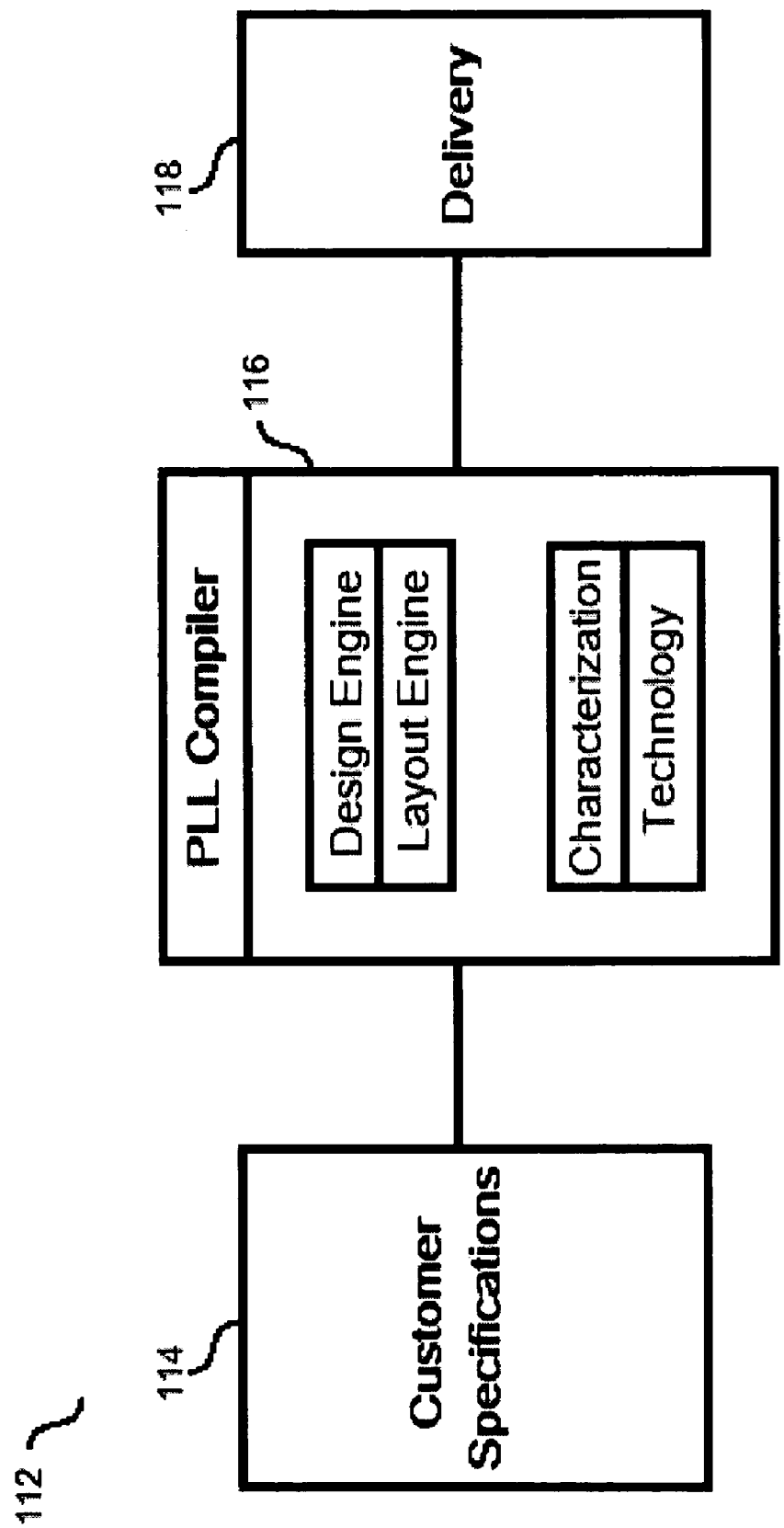
FIG. 1B illustrates a process flow of another conventional service model for providing a PLL IP to a customer of IC manufacturers.

FIG. 1B illustrates a process flow 112 of another conventional service model for providing a PLL IP to a customer of IC manufacturers. In a block 114, the customer provides the specifications of a PLL circuit design. The specifications are then programmed into a compiler in a block 116. When the programming is done, the compiler uses the specifications to create a circuit design and a layout design for the PLL. Characterization can be performed at this point to evaluate the designs. Once the customer is satisfied with the designs, the IP can be delivered to the customer in a block 118.

One drawback of the above service model is the high maintenance required by the complier. The maintenance cost usually makes it impossible for a compiler vendor to verify all of the configurations of PLL circuit in a physical semiconductor implementation. Moreover, since the PLL IP created by the complier is designed for a unique set of specifications, the flexibility of using it in various circuit designs is limited.

Figure 2:
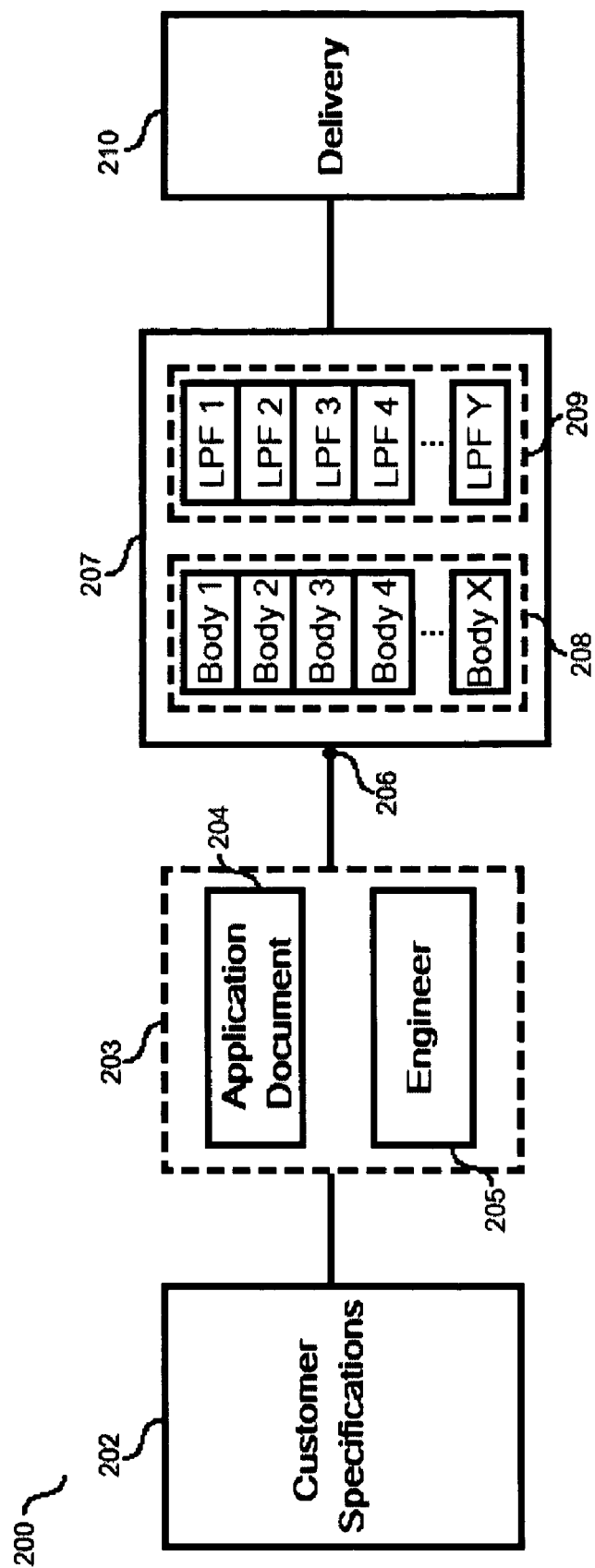
FIG. 2 illustrates a process flow of a service model for providing a PLL IP to a customer of IC manufacturers in accordance with one embodiment of the present invention.

FIG. 2 illustrates a process flow 200 of a service model for providing a PLL IP to a customer of IC manufacturers in accordance with one embodiment of the present invention. The PLL IP set is divided into a first set and a second set. Each IP of the first set represents a control and active circuit to be implemented on a semiconductor substrate. Each IP of the second set represents a filter to be implemented on the semiconductor substrate. An IP selected from the fist set can be integrated with an IP selected from the second set as an integrated IP that represents a complete PLL circuit. The integration process can be easily done by instantiating both in the design netlist and combining them in the physical layout.

The customer first provides the IP provider with the specifications of a PLL circuit design in a block 202. The specifications include information, such as the operation frequency and resolution of the PLL circuit. A block 203, which is optional, includes an application document block 204 and an engineering input block 205. In the application document block 204, the specifications and other related information are complied together. The related information may include suggestions and comments provided by one or more engineers in the engineering input block 205. The block 203 then provides the complied specifications and the related information at a node 206 to a block 207. An IP of a desired control circuit (shown as "body" in FIG. 2) that is the closest match of the specified frequency is selected from the first set 208. The control circuit includes at least a charge pump, at least a voltage controlled oscillator, at least a phase frequency detector and at least an output buffer. An IP of a desired filter (shown as "LPF" in FIG. 2) that is the closest match of the specified resolution is selected from the second set 209. The filter may be a low-pass filter (LPF). Once the selections are made, the selected control circuit IP and the filter IP can be integrated to provide an integrated PLL IP, which can then be delivered to IC manufacturers in a block 210.

Figure 3:
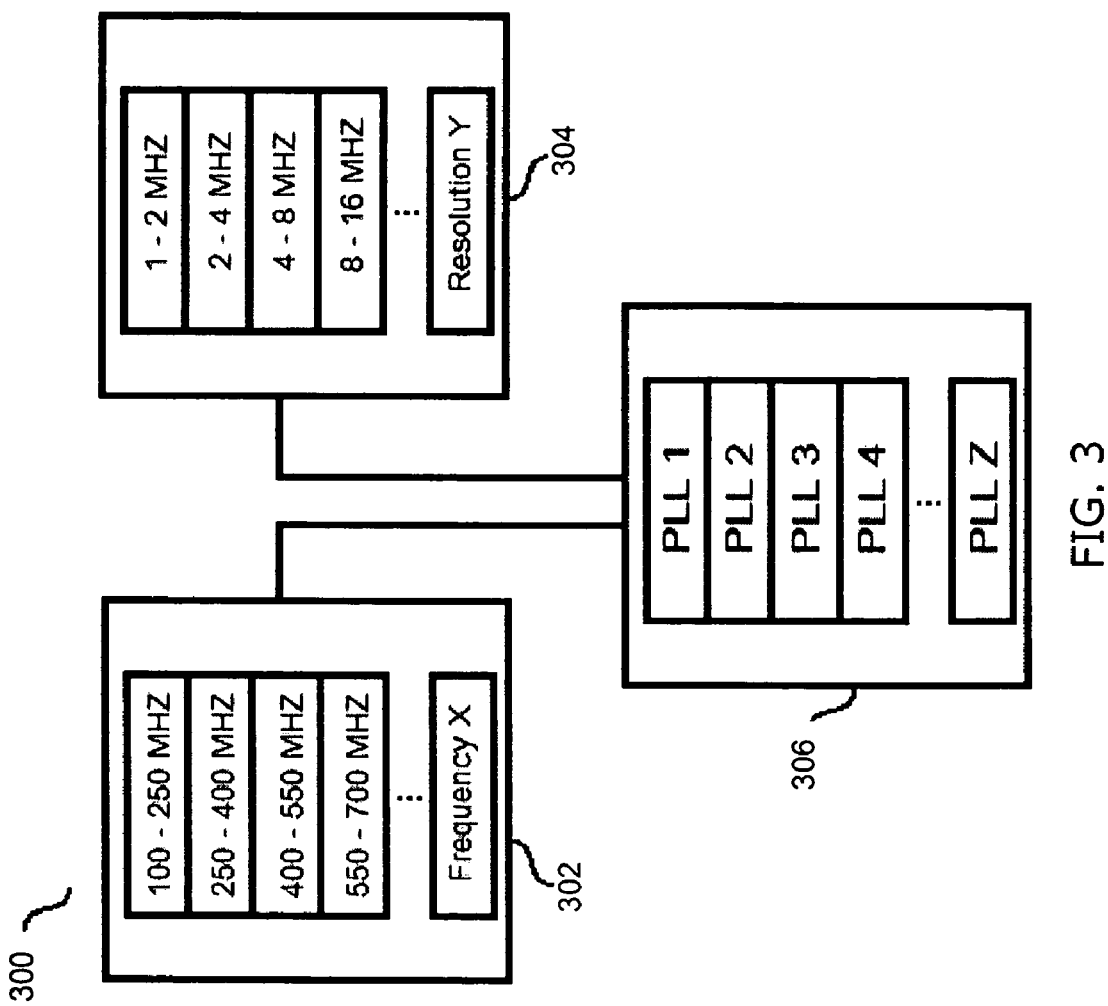
FIG. 3 illustrates a diagram for explaining how a PLL IP is provided by the proposed service model in accordance with the embodiment of the present invention.

FIG. 3 illustrates a diagram for explaining how a PLL IP is provided by integrating a control circuit IP and a filter IP in accordance with the embodiment of the present invention. The first set 302 includes a plurality of control circuit IPs, which includes multiple design views or library kits configured in a format such as the graphic design system II (GDSII) format of the design). Each frequency range within the first set 302 represents a specific, verified control circuit design that operates in that frequency range. The second set 304 includes a plurality of filter IPs. Each bandwidth within the second set 304 represents a specific design of a verified filter that operates in that bandwidth. Because the bandwidth is closely correlated to the resolution of the PLL circuit design, the resolution of the PLL circuit determines the bandwidth of the filter, and therefore the area required for implementing the filter IP on a semiconductor substrate. As the resolution gets smaller, the layout area of the implemented filter gets larger. A block 306 shows a PLL IP that can be created by integrating the control circuit IP selected from the first set 302 with the filter IP selected from the second set 304. For example, the first set 302 provides four control circuit IPs representing four control circuit deigns that operate at frequency ranges of 100-250 MHz, 250-300 MHz, 300-550 MHz, and 500-700 MHz, respectively. The second set 304 provides four filter IPs representing four filter deigns that operate at resolution ranges of 1-2 MHz, 2-4 MHz, 4-8 MHz, and 8-16 MHz, respectively. As such, there can be a total of 16 different combinations of PLL IPs that can be created from the two sets 302 and 304.

Note that within the first PLL set 302, a fixed frequency type and an adjustable frequency type of control circuit IPs can be available. The fixed frequency type of control circuit IPs provide less complicated design, while the adjustable frequency type of control circuit IPs require less maintenance effort and tap-out cost.

Because the two sets 302 and 304 provide a variety of PLL IPs for the customer to choose from, the PLL IP provided will be much closer to the specifications of the customer's PLL requirement than the generally-designed PLL IP provided by the conventional art. This helps to reduce customer cost as well as to improve the performance of the PLL circuit. As discussed above, the resolution of the filter IP determines the size of the PLL circuit. Since the resolution of the filter IP is close to the specifications, the PLL circuit will not occupy an undesirably or unnecessarily large layout area. Moreover, since the proposed PLL IP is made quasi-customarily, the jitter and lock time can also be improved significantly.

Figure 4:
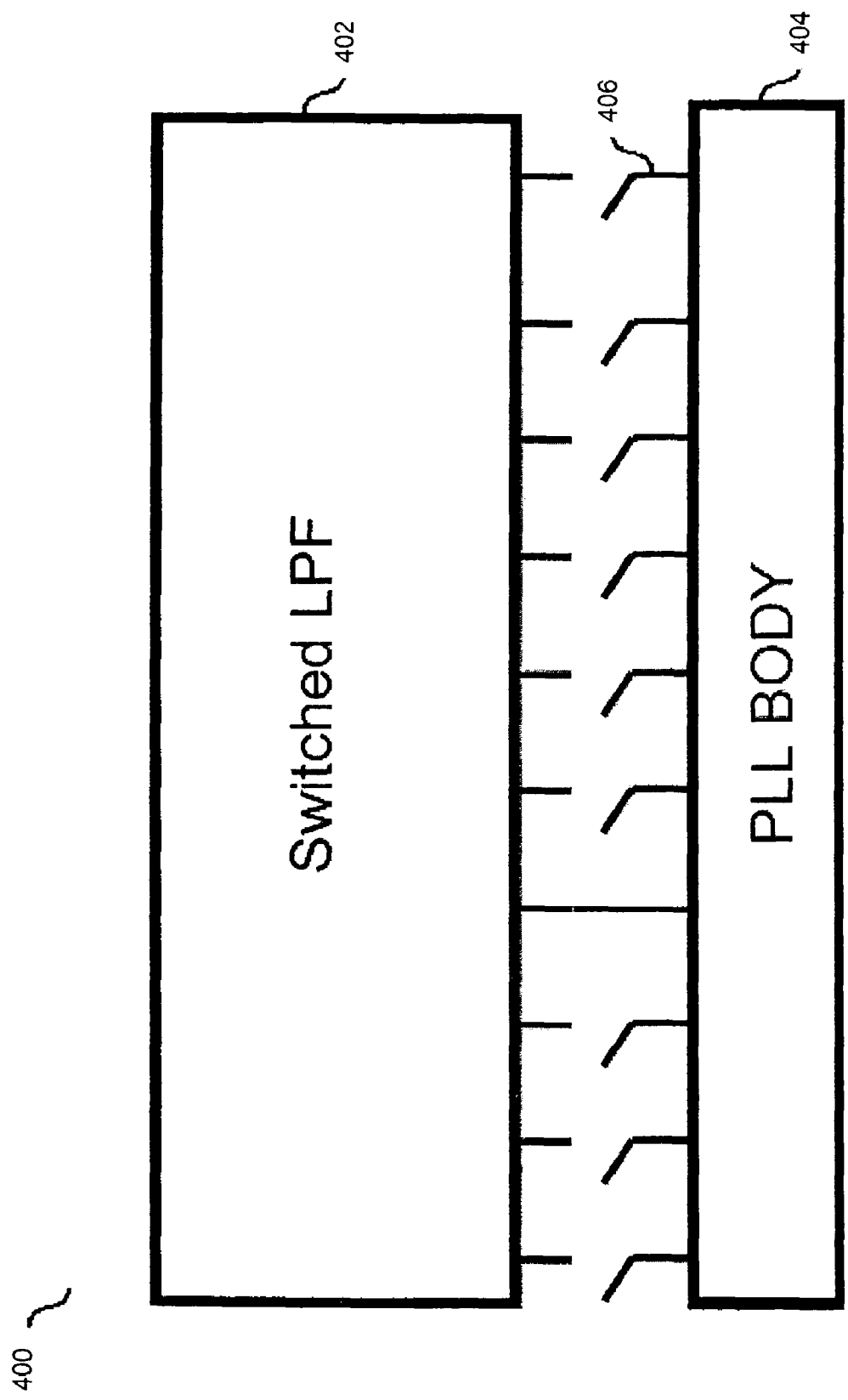
FIG. 4 illustrates a diagram for explaining how the PLL IP provided by the proposed service model is verified in accordance with the embodiment of the present invention.

FIG. 4 illustrates a diagram 400 for explaining how the PLL IP provided by the proposed service model is verified in accordance with another embodiment of the present invention. A switched test filter 402 is coupled to a PLL control circuit 404. The switched test filter 402 and the PLL control circuit 404 are implemented on a semiconductor substrate for verifying if the filter IPs can function properly after their implementation. A number of switches 406 of the switched test filter 402 help to control and fine tune its resolution. Each switch 406 can be controlled independently by a switching control circuit that is not shown within the figure. Note that at least one switch 406 has to be connected between the switched test filter 402 and the PLL control circuit 404 in order for the PLL circuit to operate properly. As shown in FIG. 4, the fourth switch (from the left) of the switches 406 is connected between the switched test filter 402 and the PLL control circuit 404.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A method for designing a phase-lock loop (PLL) circuit, the method comprising:
   providing a first set of intellectual properties, each of which represents a control circuit implemented on a semiconductor substrate;
   providing a second set of intellectual properties, each of which represents a filter implemented on the semiconductor substrate;
   selecting an intellectual property from the first set and an intellectual property from the second set based on a predetermined specification of the PLL circuit; and
   integrating the selected intellectual properties as an integrated intellectual property representing the PLL circuit, such that a layout area of the PLL circuit implemented by using the integrated intellectual property is configured based on the predetermined specification, wherein the intellectual properties of the second set are verified by using a test filter that is adjustable to operate in various resolutions.

2. The method of claim 1 wherein the first and second sets of intellectual properties are characterized into multiple design views.

3. The method of claim 1 wherein at least one intellectual property of the first set represents a control circuit whose operation frequency is adjustable in a single body.

4. The method of claim 1 wherein at least one intellectual property of the first set represents a control circuit whose operation frequency is fixed.

5. The method of claim 1 wherein the control circuit comprises a charge pump.

6. The method of claim 5 wherein the control circuit comprises a voltage controlled oscillator.

7. The method of claim 6 wherein the control circuit comprises an output buffer.

8. The method of claim 7 wherein the control circuit comprises a phase frequency detector.

9. The method of claim 1 wherein the intellectual properties of the second set represent a plurality of filters of various bandwidths.

10. The method of claim 9 wherein a size of the implemented filter depends on its resolution.

11. The method of claim 10 wherein the implemented filter is a low-pass filer.

12. A system for designing a phase-lock loop (PLL) circuit, the system comprising:
    means for providing a first set of intellectual properties, each of which represents a control circuit implemented on a semiconductor substrate;
    means for providing a second set of intellectual properties, each of which represents a filter implemented on the semiconductor substrate;
    means for selecting an intellectual property from the first set and an intellectual property from the second set based on a predetermined specification of the PLL circuit; and
    means for integrating the selected intellectual properties as an integrated intellectual property representing the PLL circuit, such that a layout area of the PLL circuit implemented by using the integrated intellectual property is configured based on the predetermined specification, wherein the intellectual properties of the second set are verified by using a test filter that is adjustable to operate in various resolutions.

13. The system of claim 12 wherein the first and second sets of intellectual properties are characterized into multiple design views.

14. The system of claim 12 wherein at least one intellectual property of the first set represents a control circuit whose operation frequency is adjustable.

15. The system of claim 12 wherein at least one intellectual property of the first set represents a control circuit whose operation frequency is fixed.

16. The system of claim 12 wherein the intellectual properties of the second set represent a plurality of filters of various resolutions.

17. The system of claim 16 wherein a size of the implemented filter depends on its resolution.

18. A method for designing a phase-lock loop (PLL) circuit, the method comprising:
    providing a first set of intellectual properties, each of which represents a control circuit of a predetermined operation frequency implemented on a semiconductor substrate;
    providing a second set of intellectual properties, each of which represents a filter of a predetermined resolution implemented on the semiconductor substrate;
    selecting an intellectual property from the first set and an intellectual property from the second set based on a predetermined specification of the PLL circuit; and
    integrating the selected intellectual properties as an integrated intellectual property representing the PLL circuit, such that a layout area of the PLL circuit implemented by using the integrated intellectual property is configured based on the predetermined specification, wherein the intellectual properties of the second set are verified by using a test filter that is adjustable to operate in various resolutions.

19. The method of claim 18 wherein the first and second sets of intellectual properties are characterized into multiple design views.

20. The method of claim 18 wherein the predetermined operation frequency is either fixed or adjustable.

21. The method of claim 18 wherein a size of the implemented filter depends on its resolution.

* * * * *